(12) United States Patent
Zhao

(10) Patent No.: US 10,790,320 B2
(45) Date of Patent: Sep. 29, 2020

(54) MANUFACTURING METHOD OF ARRAY SUBSTRATE

(71) Applicant: SHENZHEN CHINA STAR OPTOELECTRONICS TECHNOLOGY CO., LTD., Shenzhen, Guangdong (CN)

(72) Inventor: Yang Zhao, Guangdong (CN)

(73) Assignee: SHENZHEN CHINA STAR OPTOELECTRONICS TECHNOLOGY CO., LTD., Shenzhen, Guangdong (CN)

( * ) Notice: Subject to any disclaimer, the term of this patent is extended or adjusted under 35 U.S.C. 154(b) by 149 days.

(21) Appl. No.: 16/091,067

(22) PCT Filed: Sep. 13, 2018

(86) PCT No.: PCT/CN2018/105577
§ 371 (c)(1),
(2) Date: Oct. 3, 2018

(87) PCT Pub. No.: WO2019/205433
PCT Pub. Date: Oct. 31, 2019

(65) Prior Publication Data
US 2020/0168643 A1    May 28, 2020

(30) Foreign Application Priority Data
Apr. 24, 2018   (CN) .......................... 2018 1 0374156

(51) Int. Cl.
*H01L 27/12*   (2006.01)

(52) U.S. Cl.
CPC ........ *H01L 27/1288* (2013.01); *H01L 27/127* (2013.01); *H01L 27/1244* (2013.01); *H01L 27/1262* (2013.01)

(58) Field of Classification Search
None
See application file for complete search history.

(56) References Cited

U.S. PATENT DOCUMENTS

2005/0030465 A1* 2/2005 Park ...................... G02F 1/1345
349/149
2007/0269936 A1* 11/2007 Tanaka ................ G02F 1/13458
438/133

(Continued)

FOREIGN PATENT DOCUMENTS

CN    204287684 U    4/2015
CN    104617049 A    5/2015

(Continued)

*Primary Examiner* — Herve-Louis Y Assouman
(74) *Attorney, Agent, or Firm* — Leong C. Lei

(57) ABSTRACT

Provided is a manufacturing method of an array substrate. When a first photomask is used to pattern a gate insulating layer to form a plurality of first conductive vias within the OLB area, by increasing a distance between two adjacent first via patterns to more than 10 μm, the effect of gray tone mask effect is reduced as a first conductive via is formed in the gate insulating layer Thus, a slope of the first photoresist via wall is relatively gentle, so that a slope of a via wall of the first conductive via is also relatively gentle, and as a passivation layer is formed thereafter, the passivation layer can be easily formed on the wall of the first conductive via without breaking. Then, a second metal layer in the first conductive via can be completely covered by the passivation layer to avoid oxidation.

15 Claims, 4 Drawing Sheets

(56) References Cited

U.S. PATENT DOCUMENTS

2011/0186844 A1* 8/2011 Koo .................. H01L 33/00
                                                      257/59
2015/0333182 A1* 11/2015 Guo .................. H01L 27/1288
                                                      257/43

FOREIGN PATENT DOCUMENTS

| CN | 104637925 A | 5/2015 |
| CN | 106486491 A | 3/2017 |
| CN | 106941093 A | 7/2017 |
| CN | 107167970 A | 9/2017 |

* cited by examiner

MANUFACTURING METHOD OF ARRAY SUBSTRATE

RELATED APPLICATIONS

The present application is a National Phase of International Application Number PCT/CN2018/105577, filed Sep. 13, 2018, and claims the priority of China Application No. 201810374156.4, filed Apr. 24, 2018.

FIELD OF THE INVENTION

The present invention relates to a display field, and more particularly to a manufacturing method of an array substrate.

BACKGROUND OF THE INVENTION

In recent years, the Thin Film Transistor-LCD (TFT-LCD) has been rapidly developed and applied widely. Generally, the liquid crystal display panel comprises a Color Filter (CF) substrate, a Thin Film Transistor (TFT) array substrate, Liquid Crystal (LC) sandwiched between the CF substrate and TFT substrate and sealant. The working principle is that the light of backlight module is reflected to generate images by applying driving voltages to the two glass substrate for controlling the rotations of the liquid crystal molecules.

When the liquid crystal display panel normally displays, an external circuit such as a flexible circuit board (FPC) or a chip on film (COF) is required, an outer lead bonding (OLB) area connected to the panel through the lead is used for realizing the transmission of driving signals to each signal line in the display panel. The electrical connection between the external circuit and the OLB area of the display panel is accomplished through a bonding process. The bonding process is mainly used to connect an external circuit to a display panel with a pre-compression and a main-compression on a compression equipment. The external electrodes on the external circuit and the electrode lines on the display panel are pressed together by anisotropic conductive adhesive (ACF).

In the process of fabricating the TFT array substrate, it is usually required to dig the gate insulating layer (GI) in the OLB area by the photolithographic process to bridge the second metal layer (M2) and the first metal layer (M1), or to bridge the pixel electrode layer and the first metal layer. In the actual producing process, the inventors have found that the passivation layer (PV) on the second metal layer (M2) is easily damaged in the via of the gate insulating layer and causes the underlying second metal layer to be exposed and oxidized, thus affecting the performance of the entire TFT array substrate. The reason is that because the designed distance between adjacent two vias in the gate insulating layer is small. As the exposure is implemented with the mask, the pattern edges corresponding to the vias on the mask influence each other to cause the Gray Tone Mask effect (GTM effect). Accordingly, the slope of the first photoresist via wall above the gate insulating layer is relatively steep, and the slope of the via wall of the first conductive via by etching the gate insulating layer is also relatively steep causing the passivation layer to break in the via of the gate insulating layer as the passivation layer is deposited and formed, thereby causing the second metal layer to be exposed and oxidized.

SUMMARY OF THE INVENTION

An objective of the present invention is to provide a manufacturing method of an array substrate. By increasing a distance of adjacent first via patterns on a first photomask, an effect of gray tone mask effect is reduced as a first conductive via is formed in a gate insulating layer, so that a second metal layer in the first conductive via can be completely covered by a passivation layer to avoid oxidation.

For realizing the aforesaid objective, the present invention provides a manufacturing method of an array substrate, having a display area located in a center and an outer lead bonding area located at a periphery of the display area. The manufacturing method of the array substrate comprises:

Step S1, providing a base substrate, and depositing and patterning a first metal layer on the base substrate, wherein the first metal layer has a plurality of first metal wires arranged in parallel in the outer lead bonding area;

Step S2, forming a gate insulating layer covering the first metal layer on the base substrate; and coating a first photoresist layer on the gate insulating layer; and providing a first photomask and using the first photomask to expose and develop the first photoresist layer to form a plurality of first photoresist vias, which are correspondingly above the plurality of first metal wires one-to-one, in the first photoresist layer, wherein the first photomask comprises a plurality of first via patterns for correspondingly forming the plurality of first photoresist vias, and a distance between two adjacent first via patterns is greater than 10 µm;

Step S3, using the first photoresist layer as a shielding layer for etching the gate insulating layer to form a plurality of first conductive vias under the plurality of first photoresist vias correspondingly in the gate insulating layer, and correspondingly exposing the plurality of first metal wires, and removing the first photoresist layer;

Step S4, depositing and patterning a second metal layer on the gate insulating layer, wherein the second metal layer comprises a plurality of second metal wires corresponding to the first metal wires one-to-one, and the second metal wire is in contact with the corresponding first metal wire through the first conductive via; and Step S5, forming a passivation layer covering the second metal layer on the gate insulating layer.

In Step S2, the distance between two adjacent first via patterns in the first photomask is 10 µm to 12 µm.

The first metal layer formed in Step S1 further comprises a plurality of third metal wires arranged in parallel in the outer lead bonding area, and the first metal wire and the third metal wire are spaced apart;

the manufacturing method of the array substrate further comprises:

Step S6, forming a second photoresist layer on the passivation layer, and providing a second photomask and using the second photomask to expose and develop the second photoresist layer to form a plurality of second photoresist vias, which are correspondingly above the plurality of third metal wires one-to-one, in the second photoresist layer, wherein the second photomask comprises a plurality of second via patterns for correspondingly forming the plurality of second photoresist vias, and a distance between two adjacent second via patterns is greater than 10 µm;

Step S7, using the second photoresist layer as a shielding layer for etching the passivation layer and the gate insulating layer to form a plurality of second conductive vias under the plurality of second photoresist vias correspondingly in the passivation layer and the gate insulating layer, and correspondingly exposing the plurality of third metal wires, and removing the second photoresist layer:

Step S8, depositing and patterning a transparent conductive layer on the passivation layer, wherein the transparent conductive layer comprises a plurality of transparent conductive wires corresponding to the third metal wires one-to-one, and the transparent conductive wire is in contact with the corresponding third metal wire through the second conductive via.

In Step S6, the distance between two adjacent second via patterns in the second photomask is 10 μm to 12 μm.

In Step S8, a material of forming the transparent conductive layer is indium tin oxide (ITO).

In Step S2, the gate insulating layer is formed by a chemical vapor deposition method, and a material of the gate insulating layer is silicon nitride or silicon oxide.

In Step S5, the passivation layer is formed by a chemical vapor deposition method, and a material of the passivation layer is silicon nitride or silicon oxide.

Both the first metal layer and the second metal layer are a copper layer or a layer containing copper material.

The first metal layer and the second metal layer are one of a gate metal layer and a source/drain metal layer, respectively.

The array substrate is an indium gallium zinc oxide type thin film transistor array substrate.

The benefits of the present invention are: the manufacturing method of the array substrate of the present invention forms the first metal layer and the gate insulating layer in sequence on the base substrate. The first metal layer has a plurality of first metal wires arranged in parallel in the outer lead bonding area, and the first photoresist layer is used for patterning the gate insulating layer to form a plurality of first conductive vias, and correspondingly exposing the plurality of first metal wires, and a distance between two adjacent first via patterns in the plurality of first via patterns for forming the first plurality of conductive vias of the first photomask is greater than 10 μm. Finally, the second metal layer is deposited and patterned on the gate insulating layer, and the passivation layer covering the second metal layer is formed on the gate insulating layer. By increasing the distance between two adjacent first via patterns to more than 10 μm, the effect of gray tone mask effect is reduced as the first conductive via is formed in the gate insulating layer. Thus, the slope of the first photoresist via wall is relatively gentle, so that the slope of the via wall of the first conductive via is also relatively gentle, and as the passivation layer is formed thereafter, the passivation layer can be easily formed on the wall of the first conductive via without breaking. Then, the second metal layer in the first conductive via can be completely covered by the passivation layer to avoid oxidation.

BRIEF DESCRIPTION OF THE DRAWINGS

The technical solution and the beneficial effects of the present invention are best understood from the following detailed description with reference to the accompanying figures and embodiments.

In drawings.

DETAILED DESCRIPTION OF PREFERRED EMBODIMENTS

For better explaining the technical solution and the effect of the present invention, the present invention will be further described in detail with the accompanying drawings and the specific embodiments.

Figure 1:
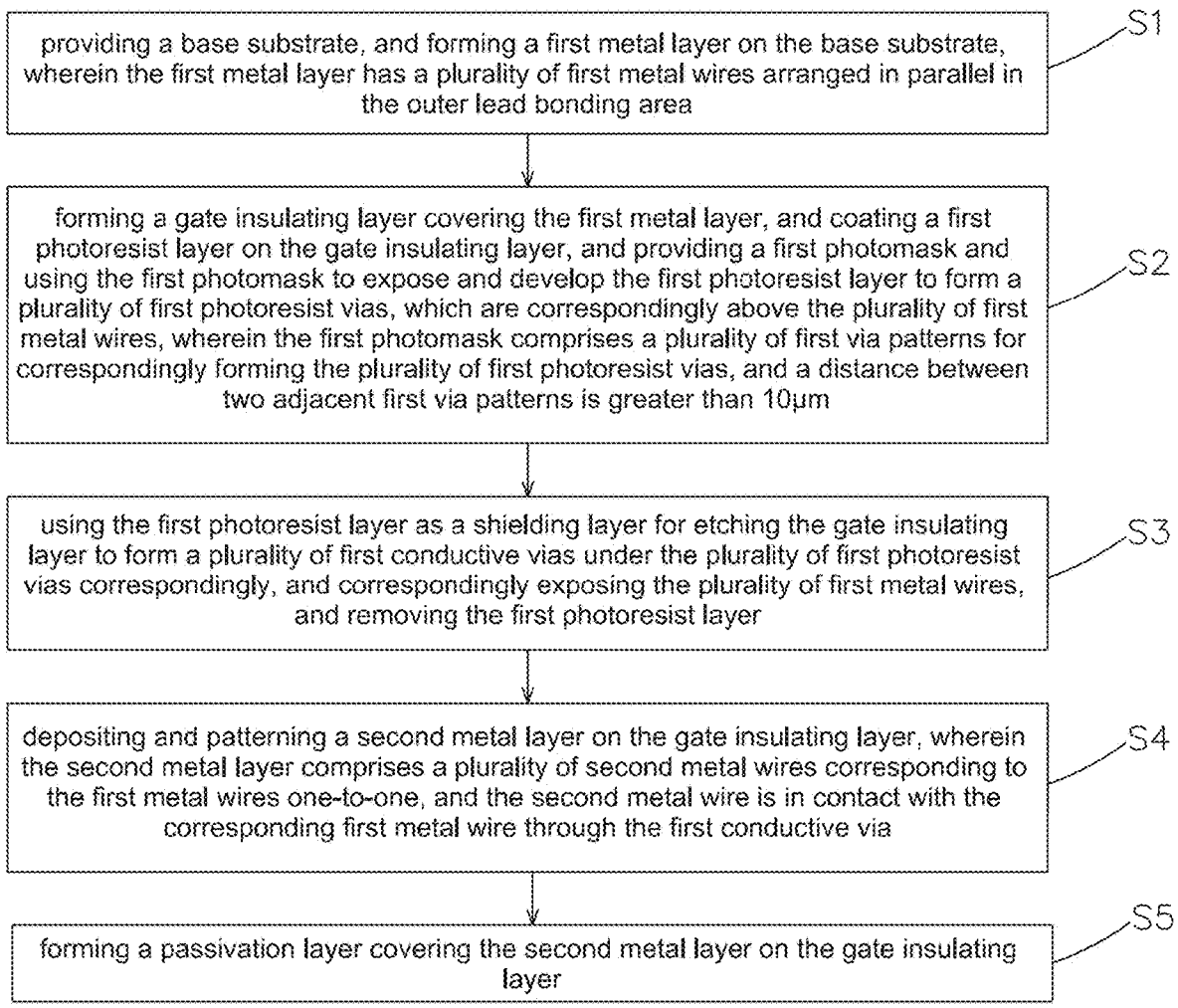
FIG. 1 is a flowchart of a manufacturing method of an array substrate according to the present invention.
Figure 2:
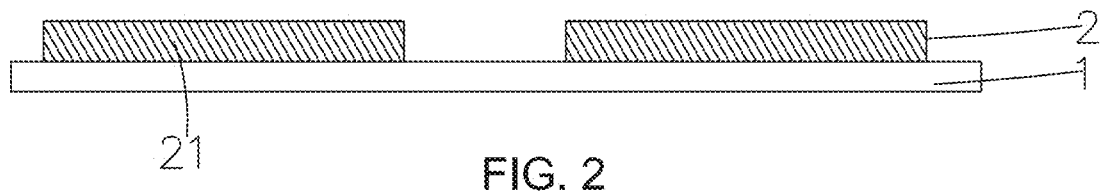
FIG. 2 is a diagram of Step S1 in a manufacturing method of an array substrate according to the present invention.

Please refer to FIG. 1. The present invention first provides a manufacturing method of an array substrate, having a display area located in a center and an outer lead bonding area located at a periphery of the display area. The manufacturing method of the array substrate specifically comprises:

Step S1, as shown in FIG. 2, providing a base substrate 1, and depositing and patterning a first metal layer 2 on the base substrate 1, wherein the first metal layer 2 has a plurality of first metal wires 21 arranged in parallel and a plurality of third metal wires 23 arranged in parallel in the outer lead bonding area.

Specifically, the first metal wire and the third metal wire are spaced apart and used for subsequent connection of different structural layers.

Figure 3:
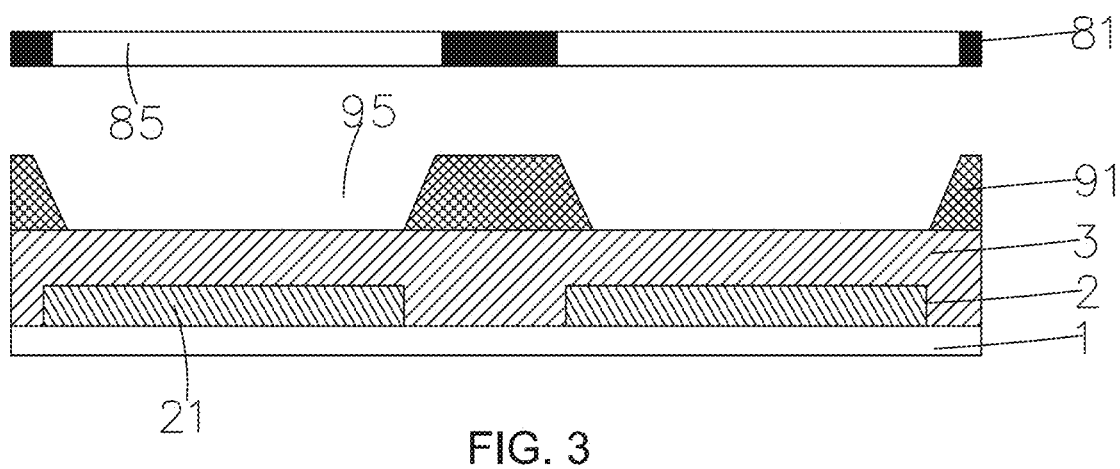
FIG. 3 is a diagram of Step S2 in a manufacturing method of an array substrate according to the present invention.

Step S2, as shown in FIG. 3, forming a gate insulating layer 3 covering the first metal layer 2 on the base substrate 1, and coating a first photoresist layer 91 on the gate insulating layer 3, and providing a first photomask 81 and using the first photomask 81 to expose and develop the first photoresist layer 91 to form a plurality of first photoresist vias 95, which are correspondingly above the plurality of first metal wires 21 one-to-one, in the first photoresist layer 91, wherein the first photomask 81 comprises a plurality of first via patterns 85 for correspondingly forming the plurality of first photoresist vias 95, and a distance between two adjacent first via patterns 85 is greater than 10 μm, thus reducing the impact of the Gray Tone Mask effect (GTM effect).

Specifically, in Step S2, the distance between two adjacent first via patterns 85 in the first photomask 81 is 10 μm to 12 μm.

Specifically, in Step S2, the gate insulating layer 3 is formed by a chemical vapor deposition (CVD) method, and a material of the gate insulating layer 3 is silicon nitride (SiNx) or silicon oxide (SiO2).

Figure 4:
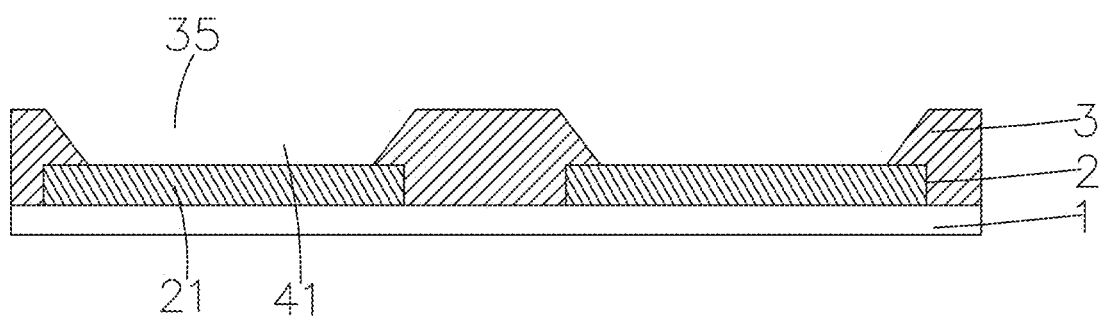
FIG. 4 is a diagram of Step S3 in a manufacturing method of an array substrate according to the present invention.

Step S3, as shown in FIG. 4, using the first photoresist layer 91 as a shielding layer for etching the gate insulating layer 3 to form a plurality of first conductive vias 35 under the plurality of first photoresist vias 95 correspondingly in the gate insulating layer 3, and correspondingly exposing the plurality of first metal wires 21, and removing the first photoresist layer 91.

Figure 5:
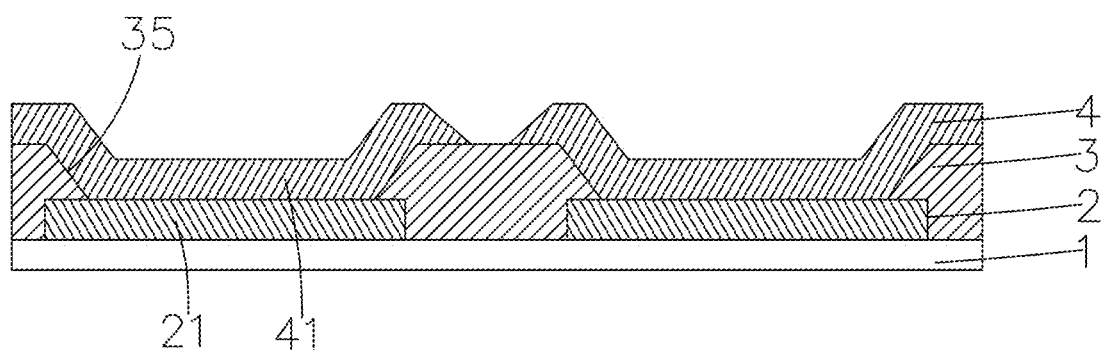
FIG. 5 is a diagram of Step S4 in a manufacturing method of an array substrate according to the present invention.

Step S4, as shown in FIG. 5, depositing and patterning a second metal layer 4 on the gate insulating layer 3, wherein the second metal layer 4 comprises a plurality of second metal wires 41 corresponding to the first metal wires 21 one-to-one, and the second metal wire 41 is in contact with the corresponding first metal wire 21 through the first conductive via 35.

Figure 6:
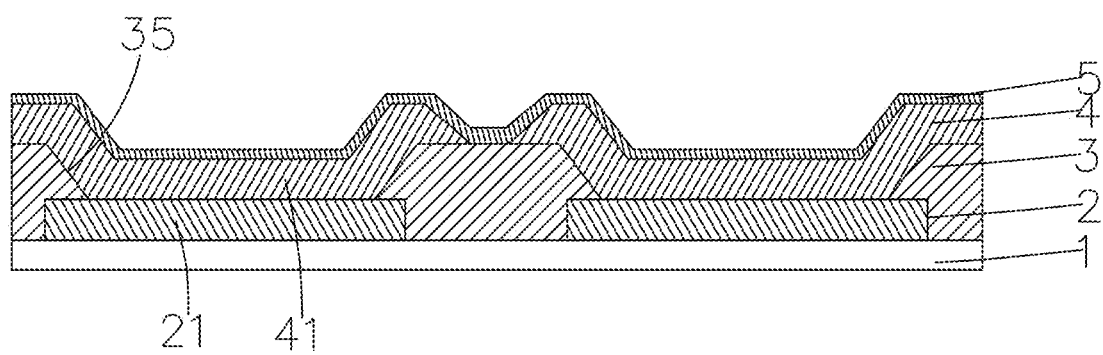
FIG. 6 is a diagram of Step S5 in a manufacturing method of an array substrate according to the present invention.

Step S5, as shown in FIG. 6, forming a passivation layer 5 covering the second metal layer 4 on the gate insulating layer 3.

Specifically, in Step S5, the passivation layer 5 is formed by a chemical vapor deposition method, and a material of the passivation layer 5 is silicon nitride or silicon oxide.

Figure 7:
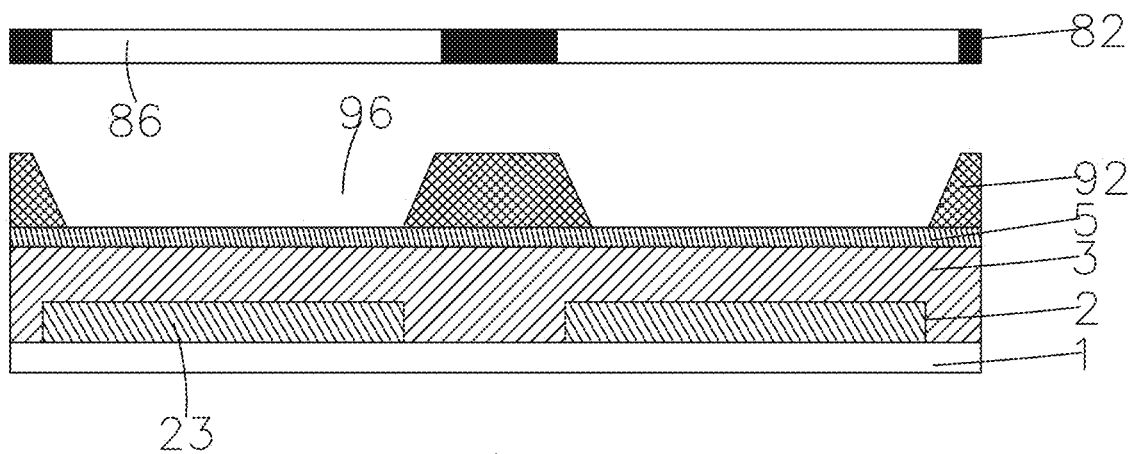
FIG. 7 is a diagram of Step S6 in a manufacturing method of an array substrate according to the present invention.

Step S6, as shown in FIG. 7, forming a second photoresist layer 92 on the passivation layer 5, and providing a second photomask 82 and using the second photomask 82 to expose and develop the second photoresist layer 92 to form a plurality of second photoresist vias 96, which are correspondingly above the plurality of third metal wires 23 one-to-one, in the second photoresist layer 92, wherein the second photomask 82 comprises a plurality of second via patterns 86 for correspondingly forming the plurality of second photoresist vias 96, and a distance between two adjacent second via patterns 86 is greater than 10 μm, thus reducing the impact of the Gray Tone Mask effect (GTM effect) while using the second photomask 82 for the patterning process.

Specifically, in Step S6, the distance between two adjacent second via patterns 86 in the second photomask 82 is 10 μm to 12 μm.

Figure 8:
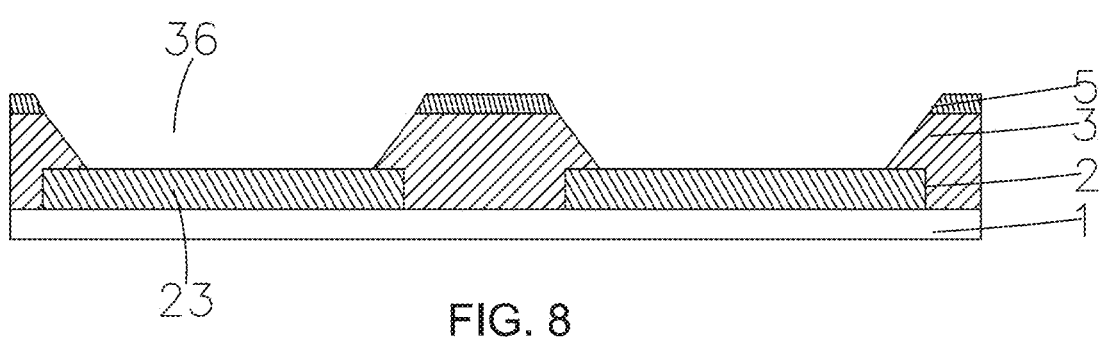
FIG. 8 is a diagram of Step S7 in a manufacturing method of an array substrate according to the present invention.

Step S7, as shown in FIG. 8, using the second photoresist layer 92 as a shielding layer for etching the passivation layer 5 and the gate insulating layer 3 to form a plurality of second conductive vias 36 correspondingly under the plurality of second photoresist vias 96 correspondingly in the passivation layer 5 and the gate insulating layer 3, and correspondingly exposing the plurality of third metal wires 23, and removing the second photoresist layer 92.

Figure 9:
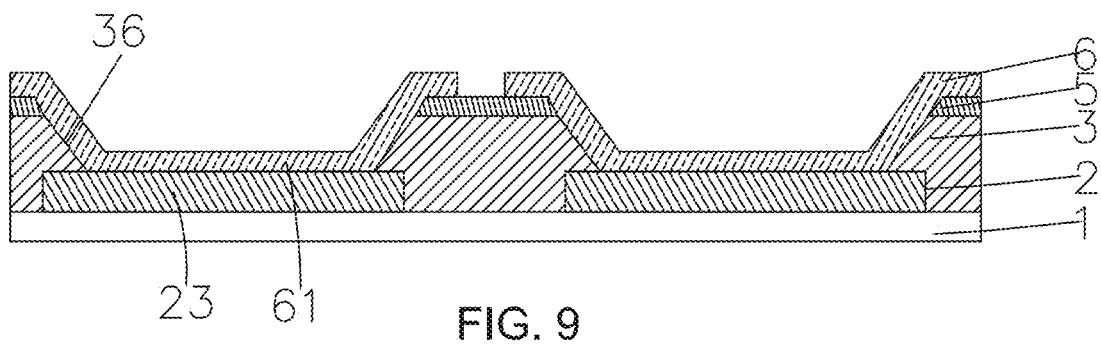
FIG. 9 is a diagram of Step S8 in a manufacturing method of an array substrate according to the present invention.

Step S8, as shown in FIG. 9, depositing and patterning a transparent conductive layer 6 on the passivation layer 5, wherein the transparent conductive layer 6 comprises a plurality of transparent conductive wires 61 corresponding to the third metal wires 23 one-to-one, and the transparent conductive wire 61 is in contact with the corresponding third metal wire 23 through the second conductive via 35.

Specifically, in Step S8, a material of forming the transparent conductive layer 6 is indium tin oxide (ITO).

Specifically, both the first metal layer 2 and the second metal layer 4 are a copper layer or a layer containing copper material.

Specifically, the first metal layer 2 and the second metal layer 4 are one of a gate metal layer and a source/drain metal layer, respectively. The gate metal layer comprises a plurality of gate lines arranged in parallel and gates of a plurality of thin film transistor elements in the display area. The source/drain metal layer comprises a plurality of data lines perpendicular to the gate lines in the display area, and source electrodes and drain electrodes of the plurality of thin film transistor elements.

Specifically, the array substrate is an indium gallium zinc oxide (IGZO) type thin film transistor array substrate. The thin film transistor elements on the array substrate are IGZO type elements.

In the manufacturing method of the array substrate of the present invention, by increasing the distance of adjacent first via patterns 85 on the first photomask 81 to more than 10 μm, an effect of gray tone mask (GTM) effect is reduced as the first conductive via 35 is formed in the gate insulating layer 3, so that the slope of the via wall of the first conductive via 35 is also relatively gentle, and as the passivation layer 5 is formed thereafter, the passivation layer 5 can be easily formed on the wall of the first conductive via 35 without breaking. Then, the second metal layer 2 in the first conductive via 35 can be completely covered by the passivation layer 5 to avoid oxidation.

Specifically, the inventors verified the technical effects of the present invention with three groups of experiments. The three groups of experiments are an experimental group, a first control group, and a second control group. In the experimental group, the first control group and the second control group, the distances between the two adjacent first via patterns 85 on the first photomask 81 are respectively set to 8 μm, 10 μm and 12 μm, and the other steps in the experimental group, the first control group and the second control group are set to be the same as the foregoing embodiment. Through experiments, it is found that the first photoresist via 95 in the experimental group is obviously affected by the GTM effect, and the slope of the via wall of the first photoresist via 95 is relatively steep, so the slope of the etched via wall of the first conductive via 35 is also relatively steep, causing the passivation layer 5 to break in the first conductive via 35 as the passivation layer 5 is deposited and formed, thereby causing the second metal layer 4 in the first conductive via 35 to be oxidized to form copper oxide; in the first control group, since the distance between the adjacent two first via patterns 85 is increased to 10 μm, the patterned gate insulating layer 3 is less affected by the GTM effect, so that the slope of the first photoresist via 95 is relatively gentle, and the slope of the via wall of the etched first conductive via 35 is also relatively gentle, and thus as the passivation layer 5 is subsequently deposited and formed, the second metal layer 4 in the first conductive via 35 can be completely covered to avoid oxidation of the second metal layer 4; in the second control group, the distance between the adjacent two first via patterns 85 is increased to 12 μm. The inventor found that as the gate insulating layer 3 is patterned to form the first conductive via 35, the GTM effect completely disappears.

In conclusion, the manufacturing method of the array substrate of the present invention forms the first metal layer and the gate insulating layer in sequence on the base substrate. The first metal layer has a plurality of first metal wires arranged in parallel in the outer lead bonding area, and the first photoresist layer is used for patterning the gate insulating layer to form a plurality of first conductive vias, and correspondingly exposing the plurality of first metal wires, and a distance between two adjacent first via patterns in the plurality of first via patterns for forming the first plurality of conductive vias of the first photomask is greater than 10 μm. Finally, the second metal layer is deposited and patterned on the gate insulating layer, and the passivation layer covering the second metal layer is formed on the gate insulating layer. By increasing the distance between two adjacent first via patterns to more than 10 μm, the effect of gray tone mask effect is reduced as the first conductive via is formed in the gate insulating layer. Thus, the slope of the first photoresist via wall is relatively gentle, so that the slope of the via wall of the first conductive via is also relatively gentle, and as the passivation layer is formed thereafter, the passivation layer can be easily formed on the wall of the first conductive via without breaking. Then, the second metal layer in the first conductive via can be completely covered by the passivation layer to avoid oxidation.

Above are only specific embodiments of the present invention, the scope of the present invention is not limited to this, and to any persons who are skilled in the art, change or replacement which is easily derived should be covered by the protected scope of the invention. Thus, the protected scope of the invention should go by the subject claims.

What is claimed is:

1. A manufacturing method of an array substrate, having a display area located in a center and an outer lead bonding area located at a periphery of the display area, comprising:

Step S1, providing a base substrate, and depositing and patterning a first metal layer on the base substrate, wherein the first metal layer has a plurality of first metal wires arranged in parallel in the outer lead bonding area;

Step S2, forming a gate insulating layer covering the first metal layer on the base substrate, and coating a first photoresist layer on the gate insulating layer, and providing a first photomask and using the first photomask to expose and develop the first photoresist layer to form a plurality of first photoresist vias, which are correspondingly above the plurality of first metal wires one-to-one, in the first photoresist layer, wherein the first photomask comprises a plurality of first via patterns for correspondingly forming the plurality of first photoresist vias, and a distance between two adjacent first via patterns is greater than 10 μm;

Step S3, using the first photoresist layer as a shielding layer for etching the gate insulating layer to form a plurality of first conductive vias under the plurality of first photoresist vias correspondingly in the gate insulating layer, and correspondingly exposing the plurality of first metal wires, and removing the first photoresist layer;

Step S4, depositing and patterning a second metal layer on the gate insulating layer, wherein the second metal layer comprises a plurality of second metal wires corresponding to the first metal wires one-to-one, and the second metal wire is in contact with the corresponding first metal wire through the first conductive via; and Step S5, forming a passivation layer covering the second metal layer on the gate insulating layer;

wherein the first metal layer formed in Step S1 further comprises a plurality of third metal wires arranged in parallel in the outer lead bonding area, and the first metal wire and the third metal wire are spaced apart;

the manufacturing method of the array substrate further comprises:

Step S6, forming a second photoresist layer on the passivation layer, and providing a second photomask and using the second photomask to expose and develop the second photoresist layer to form a plurality of second photoresist vias, which are correspondingly above the plurality of third metal wires one-to-one, in the second photoresist layer, wherein the second photomask comprises a plurality of second via patterns for correspondingly forming the plurality of second photoresist vias, and a distance between two adjacent second via patterns is greater than 10 μm;

Step S7, using the second photoresist layer as a shielding layer for etching the passivation layer and the gate insulating layer to form a plurality of second conductive vias under the plurality of second photoresist vias correspondingly in the passivation layer and the gate insulating layer, and correspondingly exposing the plurality of third metal wires, and removing the second photoresist layer;

Step S8, depositing and patterning a transparent conductive layer on the passivation layer, wherein the transparent conductive layer comprises a plurality of transparent conductive wires corresponding to the third metal wires one-to-one, and the transparent conductive wire is in contact with the corresponding third metal wire through the second conductive via.

2. The manufacturing method of the array substrate according to claim 1, wherein in Step S2, the distance between two adjacent first via patterns in the first photomask is 10 μm to 12 μm.

3. The manufacturing method of the array substrate according to claim 1, wherein in Step S6, the distance between two adjacent second via patterns in the second photomask is 10 μm to 12 μm.

4. The manufacturing method of the array substrate according to claim 1, wherein in Step S8, a material of forming the transparent conductive layer is indium tin oxide (ITO).

5. The manufacturing method of the array substrate according to claim 1, wherein in Step S2, the gate insulating layer is formed by a chemical vapor deposition method, and a material of the gate insulating layer is silicon nitride or silicon oxide.

6. The manufacturing method of the array substrate according to claim 1, wherein in Step S5, the passivation layer is formed by a chemical vapor deposition method, and a material of the passivation layer is silicon nitride or silicon oxide.

7. The manufacturing method of the array substrate according to claim 1, wherein both the first metal layer and the second metal layer are a copper layer or a layer containing copper material.

8. The manufacturing method of the array substrate according to claim 1, wherein the first metal layer and the second metal layer are one of a gate metal layer and a source/drain metal layer, respectively.

9. The manufacturing method of the array substrate according to claim 1, wherein the array substrate is an indium gallium zinc oxide type thin film transistor array substrate.

10. A manufacturing method of an array substrate, having a display area located in a center and an outer lead bonding area located at a periphery of the display area, comprising:

Step S1, providing a base substrate, and depositing and patterning a first metal layer on the base substrate, wherein the first metal layer has a plurality of first metal wires arranged in parallel and a plurality of third metal wires arranged in parallel in the outer lead bonding area, and the first metal wire and the third metal wire are spaced apart;

Step S2, forming a gate insulating layer covering the first metal layer on the base substrate, and coating a first photoresist layer on the gate insulating layer, and providing a first photomask and using the first photomask to expose and develop the first photoresist layer to form a plurality of first photoresist vias, which are correspondingly above the plurality of first metal wires one-to-one, in the first photoresist layer, wherein the first photomask comprises a plurality of first via patterns for correspondingly forming the plurality of first photoresist vias, and a distance between two adjacent first via patterns is greater than 10 μm; the gate insulating layer is formed by a chemical vapor deposition method, and a material of the gate insulating layer is silicon nitride or silicon oxide;

Step S3, using the first photoresist layer as a shielding layer for etching the gate insulating layer to form a plurality of first conductive vias under the plurality of first photoresist vias correspondingly in the gate insulating layer, and correspondingly exposing the plurality of first metal wires, and removing the first photoresist layer;

Step S4, depositing and patterning a second metal layer on the gate insulating layer, wherein the second metal layer comprises a plurality of second metal wires corresponding to the first metal wires one-to-one, and the second metal wire is in contact with the corresponding first metal wire through the first conductive via; and Step S5, forming a passivation layer covering the second metal layer on the gate insulating layer; wherein the passivation layer is formed by a chemical vapor deposition method, and a material of the passivation layer is silicon nitride or silicon oxide;

Step S6, forming a second photoresist layer on the passivation layer, and providing a second photomask and using the second photomask to expose and develop the second photoresist layer to form a plurality of second photoresist vias, which are correspondingly above the plurality of third metal wires one-to-one, in the second photoresist layer, wherein the second photomask comprises a plurality of second via patterns for correspondingly forming the plurality of second photoresist vias, and a distance between two adjacent second via patterns is greater than 10 μm;

Step S7, using the second photoresist layer as a shielding layer for etching the passivation layer and the gate insulating layer to form a plurality of second conductive vias under the plurality of second photoresist vias correspondingly in the passivation layer and the gate insulating layer, and correspondingly exposing the plurality of third metal wires, and removing the second photoresist layer;

Step S8, depositing and patterning a transparent conductive layer on the passivation layer, wherein the transparent conductive layer comprises a plurality of transparent conductive wires corresponding to the third metal wires one-to-one, and the transparent conductive wire is in contact with the corresponding third metal wire through the second conductive via; a material of the transparent conductive layer is indium tin oxide (ITO).

11. The manufacturing method of the array substrate according to claim 10, wherein in Step S2, the distance between two adjacent first via patterns in the first photomask is 10 μm to 12 μm.

12. The manufacturing method of the array substrate according to claim 10, wherein in Step S6, the distance between two adjacent second via patterns in the second photomask is 10 μm to 12 μm.

13. The manufacturing method of the array substrate according to claim 10, wherein both the first metal layer and the second metal layer are a copper layer or a layer containing copper material.

14. The manufacturing method of the array substrate according to claim 10, wherein the first metal layer and the second metal layer are one of a gate metal layer and a source/drain metal layer, respectively.

15. The manufacturing method of the array substrate according to claim 10, wherein the array substrate is an indium gallium zinc oxide type thin film transistor array substrate.

* * * * *